(12) United States Patent
Morota et al.

(10) Patent No.: US 8,896,052 B2
(45) Date of Patent: Nov. 25, 2014

(54) NONVOLATILE SEMICONDUCTOR MEMORY DEVICE AND METHOD OF MANUFACTURING THE SAME

(71) Applicants: Misako Morota, Kanagawa (JP); Hideyuki Nishizawa, Tokyo (JP); Masaya Terai, Kanagawa (JP); Shigeki Hattori, Kanagawa (JP); Koji Asakawa, Kanagawa (JP)

(72) Inventors: Misako Morota, Kanagawa (JP); Hideyuki Nishizawa, Tokyo (JP); Masaya Terai, Kanagawa (JP); Shigeki Hattori, Kanagawa (JP); Koji Asakawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/727,160

(22) Filed: Dec. 26, 2012

(65) Prior Publication Data

US 2014/0061763 A1    Mar. 6, 2014

Related U.S. Application Data

(60) Provisional application No. 61/696,954, filed on Sep. 5, 2012.

(51) Int. Cl.
| | |
|---|---|
| H01L 29/792 | (2006.01) |
| H01L 21/28 | (2006.01) |
| H01L 29/51 | (2006.01) |
| H01L 29/66 | (2006.01) |
| H01L 27/115 | (2006.01) |

(52) U.S. Cl.
CPC ......... *H01L 29/792* (2013.01); *H01L 27/11568* (2013.01); *H01L 21/28282* (2013.01); *H01L 29/513* (2013.01); *H01L 29/66833* (2013.01)

USPC .................................................. 257/324

(58) Field of Classification Search
USPC .................................................. 257/324
See application file for complete search history.

(56) References Cited

U.S. PATENT DOCUMENTS

| | | | |
|---|---|---|---|
| 4,813,016 A | 3/1989 | Okada et al. | |
| 5,077,762 A * | 12/1991 | Morimoto et al. | 377/57 |
| 5,883,397 A | 3/1999 | Isoda et al. | |
| 6,674,121 B2 | 1/2004 | Misra et al. | |
| 7,220,482 B2 * | 5/2007 | Mino et al. | 428/403 |
| 7,759,677 B2 | 7/2010 | Lee et al. | |

(Continued)

FOREIGN PATENT DOCUMENTS

| | | |
|---|---|---|
| JP | 7-22669 | 1/1995 |
| JP | 7-70690 | 7/1995 |

(Continued)

OTHER PUBLICATIONS

U.S. Appl. No. 13/602,523, filed Sep. 4, 2012, Misako Morota, et al.

(Continued)

*Primary Examiner* — Thao P Le
(74) *Attorney, Agent, or Firm* — Oblon, Spivak, McClelland, Maier & Neustadt, L.L.P.

(57) ABSTRACT

A nonvolatile semiconductor memory device of an embodiment includes: a semiconductor layer; a tunnel insulating film that is formed on the semiconductor layer and includes a first organic molecular film including first organic molecules each having an alkyl molecular chain as the main chain; a charge storage layer formed on the tunnel insulating film, the charge storage layer being made of an inorganic material; a block insulating film formed on the charge storage layer; and a control gate electrode formed on the block insulating film.

18 Claims, 10 Drawing Sheets

(56) References Cited

U.S. PATENT DOCUMENTS

| | | |
|---|---|---|
| 7,968,935 B2 | 6/2011 | Hong et al. |
| 2002/0096740 A1* | 7/2002 | Uchida et al. ............... 257/553 |
| 2003/0111670 A1 | 6/2003 | Misra et al. |
| 2004/0185600 A1 | 9/2004 | Kagan et al. |
| 2005/0062097 A1 | 3/2005 | Misra et al. |
| 2006/0125034 A1* | 6/2006 | Ohba et al. ............... 257/421 |
| 2006/0228533 A1 | 10/2006 | Nakagawa |
| 2010/0044777 A1 | 2/2010 | Hong et al. |
| 2011/0210765 A1 | 9/2011 | Hong et al. |
| 2012/0112171 A1 | 5/2012 | Hattori et al. |
| 2013/0248962 A1 | 9/2013 | Morota et al. |

FOREIGN PATENT DOCUMENTS

| | | |
|---|---|---|
| JP | 2004-311979 A | 11/2004 |
| JP | 2005-513786 | 5/2005 |
| JP | 2006-523014 | 10/2006 |
| JP | 2007-524989 A | 8/2007 |
| JP | 2009-218244 | 9/2009 |
| JP | 2010-50427 | 3/2010 |
| JP | 2010-80759 A | 4/2010 |
| JP | 2011-96784 | 5/2011 |
| JP | 2012-104675 A | 5/2012 |
| JP | 2013-197363 A | 9/2013 |

OTHER PUBLICATIONS

Yuhsuke Yasutake, et al., "Single Molecular Orientation Switching of an Endohedral Metallofullerene", Nano Letters, vol. 5, No. 6, 2005, pp. 1057-1060.

L.A. Bumm, et al., "Electron Transfer through Organic Molecules", The Journal of Physical Chemistry B, vol. 103, No. 38, 1999, pp. 8122-8127.

* cited by examiner

NONVOLATILE SEMICONDUCTOR MEMORY DEVICE AND METHOD OF MANUFACTURING THE SAME

CROSS-REFERENCE TO RELATED APPLICATION

This application is based upon and claims the benefit of priority from U.S. Provisional Application No. 61/696,954, filed on Sep. 5, 2012, the entire contents of which are incorporated herein by reference.

FIELD

Embodiments described herein relate generally to nonvolatile semiconductor memory devices and methods of manufacturing the nonvolatile semiconductor memory devices.

BACKGROUND

A NAND flash memory that is one kind of nonvolatile semiconductor memory device has a stack structure formed by stacking a semiconductor substrate, a tunnel insulating film, a charge storage layer, a block insulating film, and a control gate electrode. In such a NAND flash memory, the applied voltage of the control gate electrode is controlled. By doing so, charges are stored or erased in the charge storage layer via the tunnel insulating film from the semiconductor substrate, and the threshold voltage of each memory cell is changed. In this manner, the NAND flash memory functions as a memory device.

A flash memory needs to be scaled down, and the film thicknesses of all the layers in the stack structure need to be made smaller, so as to improve or maintain performance. In a flash memory, insulating films such as a tunnel insulating film and a block insulating film account for a large proportion of the overall layer thickness. Therefore, the thicknesses of the insulating films such as a tunnel insulating film and a block insulating film are expected to be reduced.

However, an insulating film made of an inorganic material such as an oxide film or a nitride film needs to maintain a certain film thickness, so as to reduce charge releases due to a defect or the like in the insulating film. Therefore, it is difficult to reduce film thicknesses.

DETAILED DESCRIPTION

A nonvolatile semiconductor memory device of an embodiment includes: a semiconductor layer; a tunnel insulating film that is formed on the semiconductor layer and includes a first organic molecular film including first organic molecules each having an alkyl molecular chain as the main chain; a charge storage layer formed on the tunnel insulating film, the charge storage layer being made of an inorganic material; a block insulating film formed on the charge storage layer; and a control gate electrode formed on the block insulating film.

The following is a description of embodiments, with reference to the accompanying drawings.

First Embodiment

A nonvolatile semiconductor memory device of this embodiment includes: a semiconductor layer; a tunnel insulating film that is formed on the semiconductor layer and includes a first organic molecular film including first organic molecules each having an alkyl molecular chain as the main chain; a charge storage layer formed on the tunnel insulating film, the charge storage layer being made of an inorganic material; a block insulating film formed on the charge storage layer; and a control gate electrode formed on the block insulating film.

Having the tunnel insulating film formed with organic molecules, the nonvolatile semiconductor memory device of this embodiment can have memory transistors with thinner film structures. Thus, the aspect ratio of the electrode structure of each memory cell is lowered, and microfabrication becomes easier. As the aspect ratio of the electrode structure is lowered, the coupling between adjacent memory cells is reduced, and false operations due to interference between cells are prevented. Thus, the memory cells can be made even smaller, and a scaled down nonvolatile semiconductor memory device can be realized.

Figure 1:
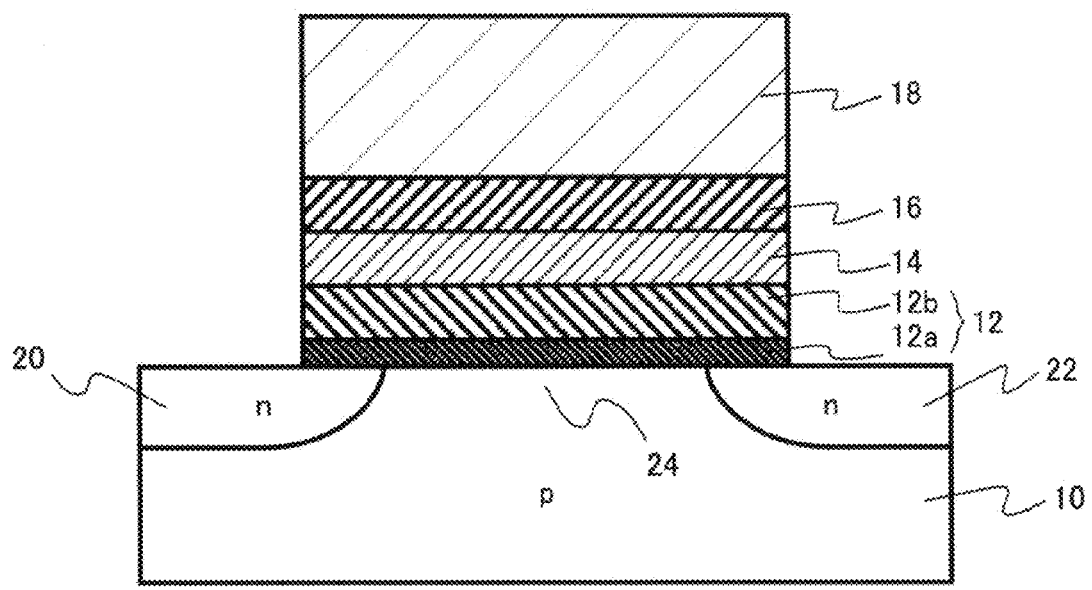
FIG. 1 is a cross-sectional view of a memory cell portion of a nonvolatile semiconductor memory device according to a first embodiment.
Figure 2:
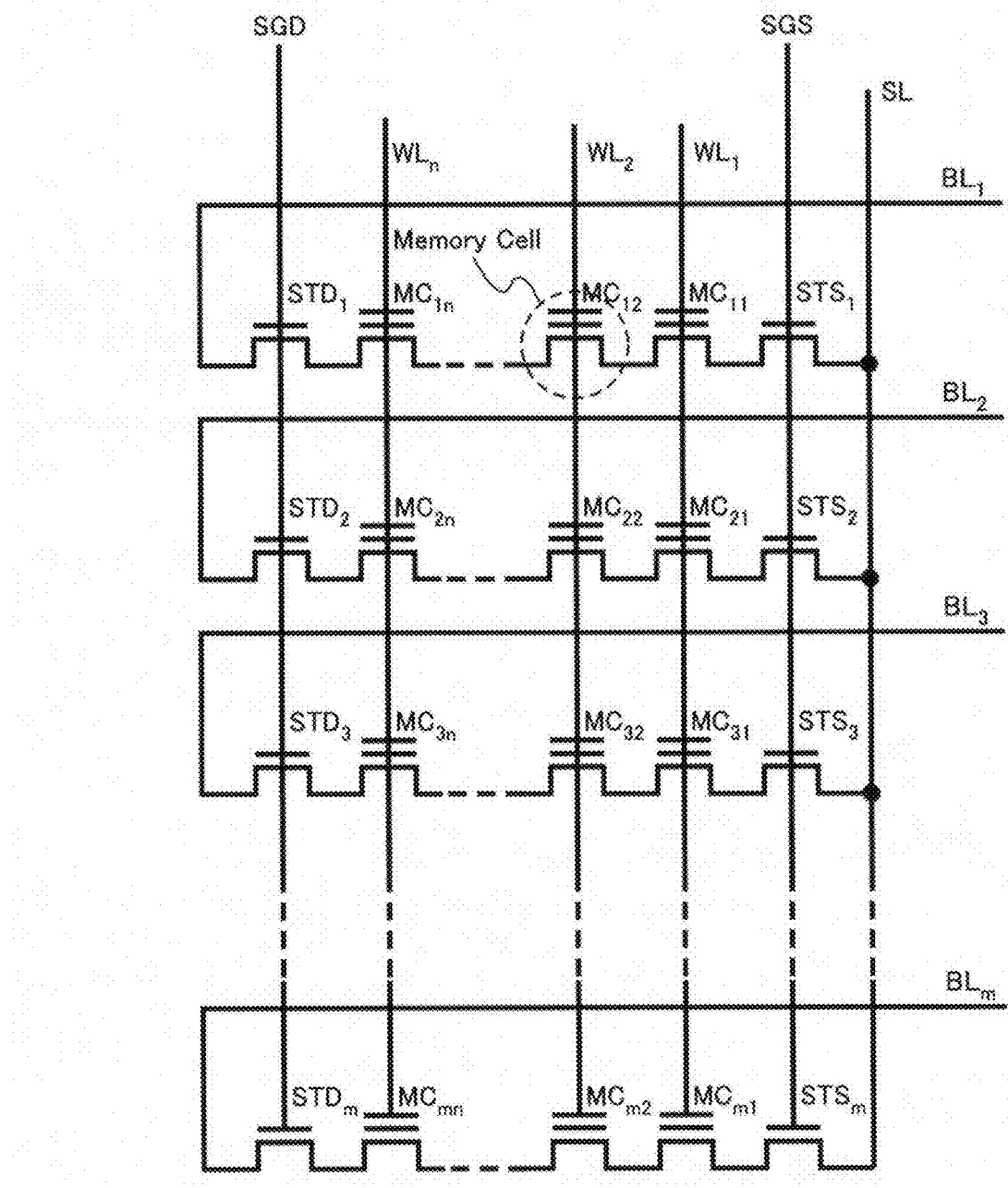
FIG. 2 is a circuit diagram of the memory cell array of the nonvolatile semiconductor memory device according to the first embodiment.
Figure 3:
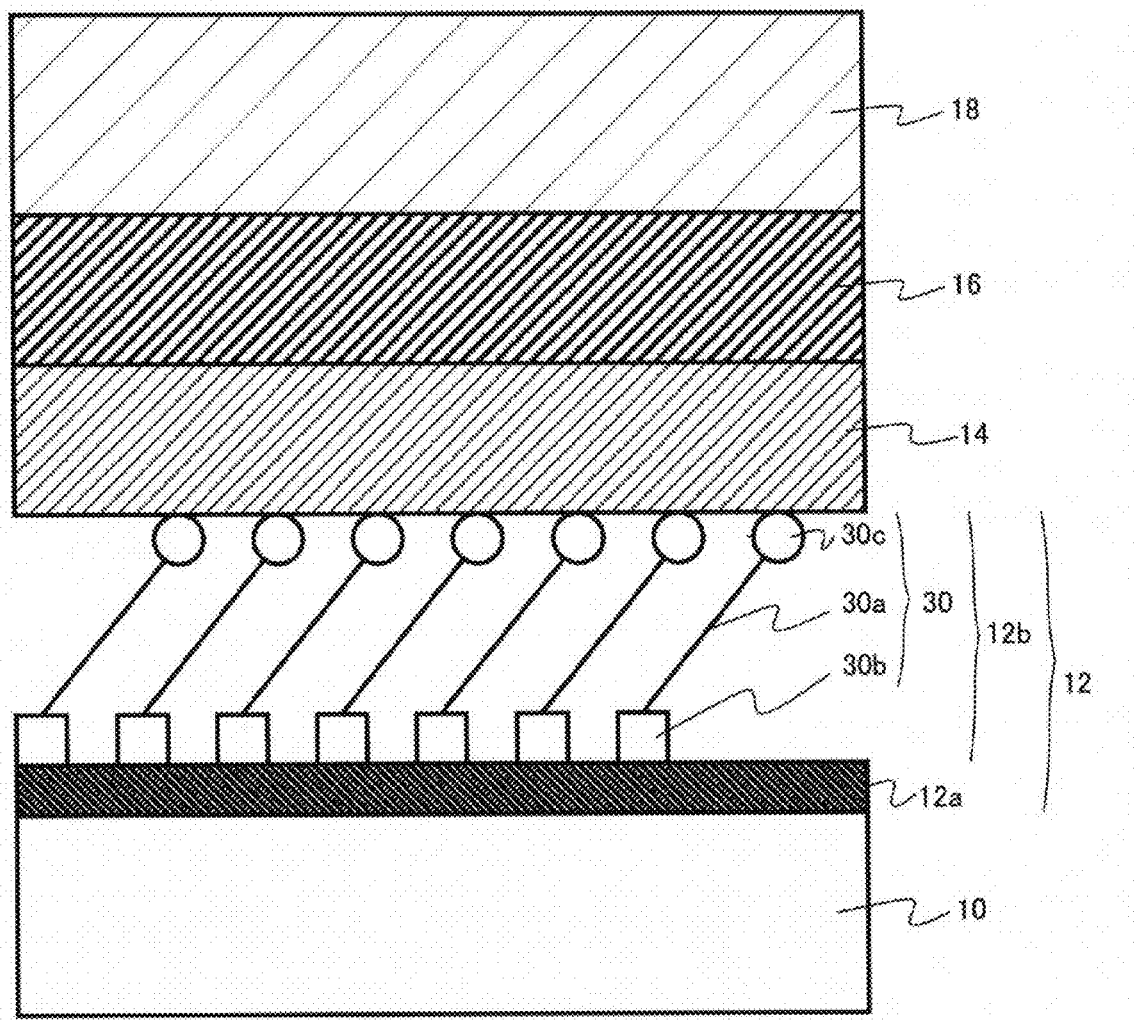
FIG. 3 is an enlarged cross-sectional view of a memory cell portion of the nonvolatile semiconductor memory device according to the first embodiment.

FIG. 1 is a cross-sectional view of a memory cell portion of the nonvolatile semiconductor memory device according to this embodiment. FIG. 2 is a circuit diagram of the memory cell array of the nonvolatile semiconductor memory device according to this embodiment. FIG. 3 is an enlarged cross-sectional view of a memory cell portion of the nonvolatile semiconductor memory device according to this embodiment. The nonvolatile semiconductor memory device of this embodiment is a NAND nonvolatile semiconductor memory device.

As shown in FIG. 2, the memory cell array is formed with memory cell transistors $MC_{11}$ through $MC_{1n}$, $MC_{21}$ through $MC_{2n}$, ..., and $MC_{m1}$ through $MC_{mn}$, which are (m×n) transistors (m and n being integers) with floating-gate structures, for example. In the memory cell array, those memory cell transistors are arranged in the column direction and in the row direction, and are thus arranged in a matrix fashion.

In the memory cell array, the memory cell transistors $MC_{11}$ through $MC_{1n}$, and select gate transistors $STS_1$ and $STD_1$ are connected in series, to form a NAND string (a memory string) that is a cell unit.

The drain region of the select gate transistor $STS_1$ for selecting the memory cell transistors $MC_{11}$ through $MC_{1n}$ is connected to the source region of the memory cell transistor $MC_{11}$ located at an end of the row of the memory cell transistors $MC_{11}$ through $MC_{1n}$, which are connected in series. Also, the source region of the select gate transistor $STD_1$ for selecting the memory cell transistors $MC_{11}$ through $MC_{1n}$ is connected to the drain region of the memory cell transistor $MC_{1n}$ located at an end of the row of the memory cell transistors $MC_{11}$ through $MC_{1n}$, which are connected in series.

Select gate transistors $STS_2$ through $STS_m$, the memory cell transistors $MC_{21}$ through $MC_{2n}$, . . . , and $MC_{m1}$ through $MC_{mn}$, and select gate transistors $STD_2$ through $STD_m$ are also connected in series, to form respective NAND strings.

A common source line SL is connected to the sources of the select gate transistors $STS_1$ through $STS_m$.

The memory cell transistors $MC_{11}$, $MC_{21}$, . . . , and $MC_{m1}$, the memory cell transistors $MC_{12}$, $MC_{22}$, . . . , and $MC_{m2}$, . . . and the memory cell transistors $MC_{1n}$, $MC_{2n}$, . . . , and $MC_{mn}$, are connected by respective word lines $WL_1$ through $WL_n$, which control the operating voltages to be applied to the control gate electrodes.

Also, a common select gate line SGS is provided for the select gate transistors $STS_1$ through $STS_m$, and a common select gate line SGD is provided for the select gate transistors $STD_1$ through $STD_m$.

Peripheral circuits (not shown) are formed around the memory cell array illustrated in FIG. 2.

FIG. 1 shows the cross-section of a memory cell in the memory cell array illustrated in FIG. 2, or of the memory cell surrounded by a dashed line in FIG. 2, for example. In this embodiment, the transistors of the memory cells are n-type transistors having electrons as carriers, for example.

The memory cells are formed on a p-type silicon semiconductor layer 10 containing p-type impurities, for example. A tunnel insulating film 12 is formed on the silicon semiconductor layer 10, a charge storage layer 14 is formed on the tunnel insulating film 12, a block insulating film 16 is formed on the charge storage layer 14, and a control gate electrode 18 is formed on the block insulating film 16. On both sides of the control gate electrode 18, a source region 20 and a drain region 22 are formed in the semiconductor layer 10. The region located below the gate electrode 18 in the semiconductor layer 10 serves as a channel region 24. The channel region 24 is interposed between the source region 20 and the drain region 22.

Here, the charge storage layer 14 has a function to actively store charges as memory cell information. When writing or erasing is performed on the memory cell, the tunnel insulating film 12 functions as an electron/hole transfer pathway between the channel region 24 in the semiconductor layer 10 and the charge storage layer 14 through a tunneling phenomenon. At the time of reading or standing by, the tunnel insulating film 12 functions to restrain electron/hole transfers between the channel region 24 and the charge storage layer 14 by its barrier height. The block insulating film 16 is a so-called interelectrode insulating film, and has a function to block the electron/hole flow between the charge storage layer 14 and the control gate electrode 18.

Other than silicon, a semiconductor such as silicon germanide, germanium, or a compound semiconductor can be used as the semiconductor layer 10.

FIG. 3 is an enlarged cross-sectional view of a memory cell portion of the nonvolatile semiconductor memory device according to this embodiment. FIG. 3 is a diagram schematically showing the tunnel insulating film 12.

The tunnel insulating film 12 includes a first organic molecular film 12b including tunnel molecules (first organic molecules) 30 each having an alkyl molecular chain as the main chain. In this embodiment, the tunnel insulating film 12 has a stack structure formed with an oxide film 12a formed on the semiconductor layer 10 and the first organic molecular film 12b formed on the oxide film 12a.

The oxide film 12a is a silicon oxide film or an aluminum oxide film, for example. The film thickness of the oxide film 12a is approximately 0.5 to 10 nm. To prevent an increase in the film thickness of the tunnel insulating film 12, the film thickness of the oxide film 12a is preferably 5 nm or less. As the oxide film 12a is provided, the breakdown resistance and the charge retention characteristics of the tunnel insulating film 12 can be improved, and the process of forming the first organic molecular film 12b can be facilitated.

In a case where the semiconductor layer 10 is made of silicon, a silicon oxide film can be easily formed on the semiconductor layer 10 through thermal oxidation or natural oxidation. On the other hand, an aluminum oxide film has the advantage of providing more end groups at the end portions to be bound to the aluminum oxide of the first organic molecules when the first organic molecular film 12b is formed by binding the first organic molecules to the upper surface of the aluminum oxide film in a self-assembling manner.

The first organic molecular film 12b is preferably a self-assembled monolayer. This is because a self-assembled monolayer can be thin, and be also stable with the tunnel molecules 30 provided at a high density.

The film thickness of the first organic molecular film 12b is approximately 1 to 5 nm.

The tunnel molecules 30 forming the first organic molecular film 12b each include a main chain 30a, an end group (a first end group) 30b on the side of the semiconductor layer 10, and an end group (a second end group) 30c on the side of the charge storage layer 14.

The main chains 30a of the tunnel molecules 30 are alkyl molecular chains. The alkyl molecular chains may be alkyl chains, isoalkyl chains, or alkyl halide chains, for example. The tunnel molecules 30 may have side chains.

The carbon number in each of the main chains 30a is preferably 8 to 30, or more preferably, 10 to 20. Even more preferably, the carbon number is 18. Although it may depends on a kind of end group and bonding state of molecules, a film thickness of the first organic molecular film 12b (a distance between a upper surface of the oxide film 12a and a lower surface of the charge storage layer 14) is about 0.5 nm and 5 nm respectively when the carbon number is 8 and 30. Therefore, the film thickness of the first organic molecular film 12b is preferably greater than or equal to 0.5 nm and less than or equal to 5 nm. In the same manner, because a film thickness of the first organic molecular film 12b is about 0.8 nm and 3.5 nm respectively when the carbon number is 10 and 20, the film thickness of the first organic molecular film 12b is more preferably greater than or equal to 0.8 nm and less than or equal to 3.5 nm.

In the following, an example case where the main chains 30a are alkyl chains is described.

The alkyl chains are formed as a self-assembled monolayer above the semiconductor layer 10, for example, and is a high-density film. The alkyl chains of the self-assembled monolayer are formed at an angle to the upper surface of the semiconductor layer 10. The wave functions of the alkyl chains spread only in the bonding direction, but do not spread in the thickness direction or in a direction perpendicular to the surface of the semiconductor layer 10. Accordingly, the probability of carriers tunneling to the outside (the tunneling probability), which is proportional to overlaps among the wave functions, becomes small.

Also, the constituent atoms are smaller than those in a silicon oxide film, and the outermost electron orbital is also smaller, for example. Accordingly, the spread of the wave functions becomes narrower. As a result, the tunneling probability proportional to overlaps among the wave functions becomes smaller than that in a silicon oxide film in principle.

The tunneling current I proportional to the tunneling probability exponentially decreases with respect to the length L of the alkyl chains, or varies as indicated by the following formula:

$$I \propto \exp(-\alpha L) \quad \text{[Formula 1]}$$

where $\alpha$ is 0.12 (nm$^{-1}$) in the alkyl chains. Accordingly, when the number of C—C bonds increases by one, the tunneling current can be reduced to almost 1/10. That is, by increasing the number of C—C bonds and increasing the alkyl chain length, the charge release from the charge storage layer 14 can be reduced.

Furthermore, the alkyl chains of the self-assembled monolayer are formed at an angle to the upper surface of the semiconductor layer 10. Therefore, when the alkyl chain length is increased, the thickness of the first organic molecular film 12b increases by an amount equivalent to the product of the alkyl chain length and the sine of the angle with respect to the semiconductor layer 10. Accordingly, the insulation properties are improved, without an excess increase in the film thickness.

So as to reduce the thickness of the tunnel insulating film 12, the angle of the extending direction of each alkyl chain with respect to the normal direction of the upper surface of the semiconductor layer 10 is preferably 30 degrees or more, or more preferably, 45 degrees or more, or even more preferably, 60 degrees or more.

For the above reasons, the tunnel insulating film 12 includes alkyl chains, particularly alkyl chains formed as a self-assembled monolayer. In this manner, higher insulation properties than in a silicon oxide film of the same film thickness, for example, can be secured. Accordingly, the tunnel insulating film 12 can be made thinner than in a case where a silicon oxide film is used.

The carbon number in each of the alkyl chains is preferably 8 to 30, or more preferably, 10 to 20. This is because, if the carbon number is below the above mentioned range, insulation resistance might be degraded, and formation of a self-assembled monolayer might become difficult. If the carbon number is beyond the above mentioned range, the film thickness might become greater, resulting in difficulties in scaling down. The carbon number in each of the alkyl chains is more preferably 18, because a self-assembled monolayer can be stably manufactured with such a carbon number.

The permittivity of the alkyl chains is approximately 2 to 3, which is higher than that of vacuum. Accordingly, the electric field applied to the insulating region is smaller than in vacuum. Therefore, the FN (Fowler-Nordheim) tunneling probability is made lower, compared with vacuum. As the alkyl chain density becomes higher, and the gaps (vacuum) among the alkyl chains become narrower, the insulation properties of the tunnel insulating film 12 become higher. In view of this, it is preferable to form the alkyl chains as a self-assembled monolayer.

Among molecules that can be self-assembled, alkyl chains have stable intermolecular forces acting among themselves, and accordingly, have the advantage of being able to readily form high-density films.

Although an example case where the alkyl molecular chains are alkyl chains has been described above, the same actions and effects as above are achieved with some other alkyl molecular chains.

The tunnel molecules 30 are preferably bound chemically to the oxide film 12a by the end groups (the first end groups) 30b on the side of the semiconductor layer 10. In a case where the first organic molecular film 12b is a self-assembled monolayer, the chemical binding is inevitable. Also, the tunnel molecules 30 are preferably bound chemically to the inorganic material in the charge storage layer 14 by the end groups (the second end groups) 30c on the side of the charge storage layer 14.

This is because, as the tunnel molecules 30 constituting the first organic molecular film 12b are bound chemically to the oxide film 12a and the charge storage layer 14 as described above, the stability of the film structure is increased, and a nonvolatile semiconductor device with smaller property fluctuations can be realized.

The tunnel molecules (the first organic molecules) 30 are molecules expressed by the following general formula (1) or (2), for example:

$$R_1-(CX_2)_n-R_2 \quad \text{[General formula (1)]}$$

Here, $R_1$ represents the end group (the first end group) on the semiconductor layer side, which may be a silyl group or a derivative thereof, or a phosphoryl group or a derivative thereof, for example. $R_2$ represents the end group (the second end group) on the charge storage layer side, which may be a hydroxy group, an amino group, an azido group, a carboxyl group, or a derivative of any of those groups, for example. X represents hydrogen (H), fluorine (F), chlorine (Cl), bromine (Br), iodine (I). Meanwhile, n represents a positive integer.

$$R_1-\left(\begin{array}{c} C \\ | \\ CX_3 \end{array}\right)_n-R_2 \quad \text{[General formula (2)]}$$

Here, $R_1$ represents the first end group on the semiconductor layer side, which may be a silyl group or a derivative thereof, or a phosphoryl group or a derivative thereof, for example. $R_2$ represents the second end group on the charge storage layer side, which may be a hydroxy group, an amino group, an azido group, a carboxyl group, or a derivative of any of those groups, for example. X represents hydrogen (H), fluorine (F), chlorine (Cl), bromine (Br), iodine (I). Meanwhile, n represents a positive integer.

The charge storage layer 14 is made of an inorganic material such as an oxide, a nitride, an oxynitride, a metal, or a metal semiconductor compound. As the charge storage layer 14 is made of an inorganic material, the degree of freedom in the process of forming the charge storage layer 14 becomes higher than in a case where the charge storage layer 14 is formed with organic molecules, for example.

The charge storage layer 14 is made of silicon nitride, silicon oxynitride, aluminum oxide, aluminum oxynitride, hafnium oxide (hafnia), hafnium nitride, hafnium oxynitride, hafnium aluminate, hafnium nitride aluminate, hafnium silicate, hafnium nitride silicate, lanthanum oxide, lanthanum aluminate, gold, aluminum, or carbon, for example. Carbon forms a structure such as a fullerene or a graphene.

To increase the process consistency with the tunnel insulating film 12 including organic molecules, the charge storage layer 14 is preferably made of an oxide, a nitride, or an oxynitride.

As described above, the tunnel molecules 30 are preferably bound chemically to the oxide film 12a by the end groups (the first end groups) 30b on the side of the semiconductor layer 10. Also, the tunnel molecules 30 are preferably bound chemically to the inorganic material in the charge storage layer 14 by the end groups (the second end groups) 30c on the side of the charge storage layer 14.

Therefore, a functional group that is easily bound chemically to the oxide film 12a is preferably selected as each end group (each first end group) 30b on the side of the semiconductor layer 10, and a functional group that is easily bound to the inorganic material in the charge storage layer 14 is preferably selected as each end group (each second end group) 30c on the side of the charge storage layer 14.

The preferred first end group 30b varies depending on the material of the oxide film 12a on the other side. In a case where the oxide film 12a is a silicon oxide film, for example, a silyl group or a derivative thereof can be selected.

The preferred second end group 30c varies depending on the material of the charge storage layer 14 on the other end. In a case where the charge storage layer 14 is made of hafnium oxide, for example, an azido group or a derivative thereof can be selected.

Figure 4:
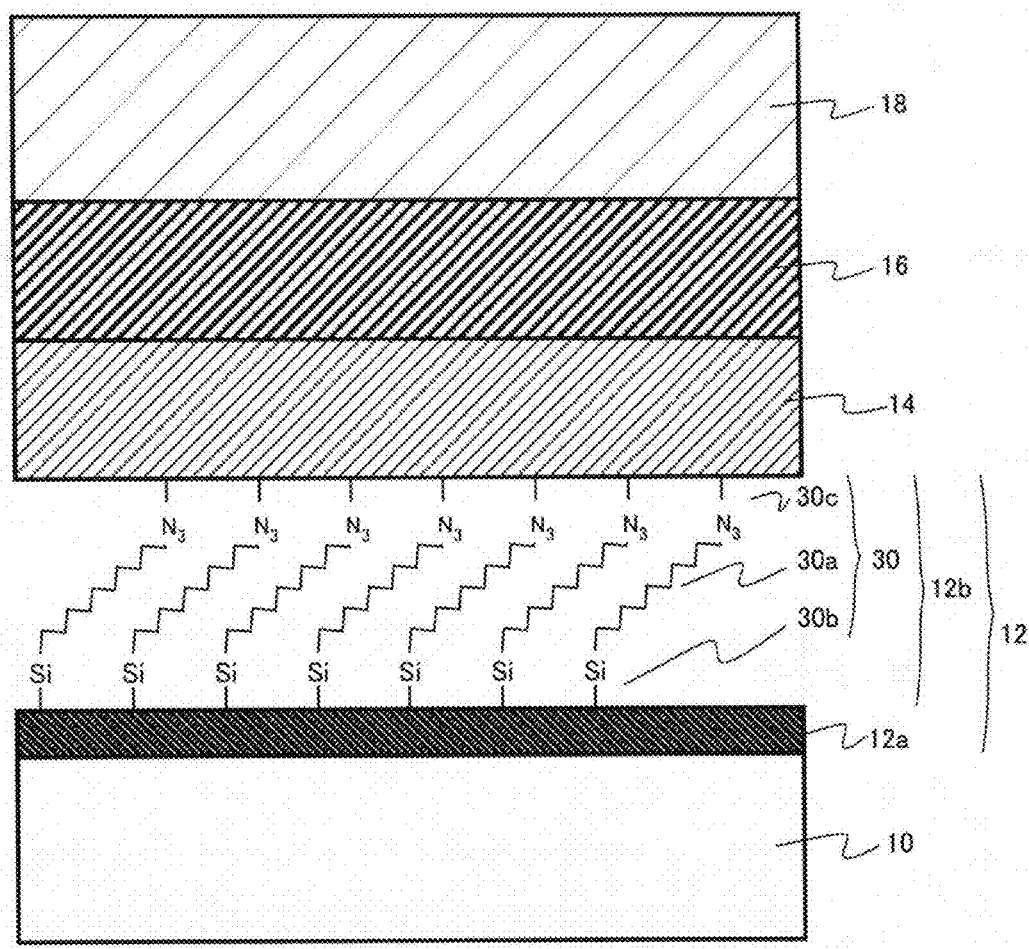
FIG. 4 is a diagram showing an example of the organic molecular film of a memory cell portion of the nonvolatile semiconductor memory device according to the first embodiment.

FIG. 4 is a diagram showing an example of the organic molecular film of a memory cell portion of the nonvolatile semiconductor memory device according to this embodiment. In the illustrated example, each main chain 30a is an alkyl chain with a carbon number of 9, each end group (each first end group) 30b on the side of the semiconductor layer 10 is a silyl group, and each end group (each second end group) 30c on the side of the charge storage layer 14 is an azido group. The oxide film 12a is made of silicon oxide, for example, and the charge storage layer 14 is made of hafnium oxide, for example.

Other preferred combinations of the oxide film 12a and the first end groups 30b are silicon oxide and silyl groups, or aluminum oxide and phosphone groups, for example.

Also, other preferred combinations of the charge storage layer 14 and the second end groups 30c are SiN (silicon nitride) and silyl groups, n-type silicon and silyl groups, p-type silicon and silyl groups, hafnium oxide and phosphone groups, and aluminum and phosphone groups, for example.

The block insulating film 16 is made of a metal oxide such as aluminum oxide or silicon oxide. Other than aluminum oxide or silicon oxide, any of various known materials can be used as the block insulating film 16. The block insulating film 16 may be either a single-layer film or a film stack.

The control gate electrode 18 is polycrystalline silicon that has impurities introduced thereinto and has obtained conductive properties. Any conductive material can be used as the control gate electrode 18. Other than the above-mentioned polycrystalline silicon, amorphous silicon that has impurities introduced thereinto and has obtained conductive properties can be used as the control gate electrode 18. Also, a metal, an alloy, a metal semiconductor compound, or the like may be used as the control gate electrode 18.

The source region 20 and the drain region 22 are formed with n-type diffusion layers containing n-type impurities, for example.

Although the tunnel insulating film 12 has been described as a two-layer structure formed with the oxide film 12a and the first organic molecular film 12b, the tunnel insulating film 12 may have a structure that is formed with three or more layers by inserting another oxide film between the first organic molecular film 12b and the charge storage layer 14, for example.

Next, a method of manufacturing the nonvolatile semiconductor memory device according to this embodiment is described. The method of manufacturing the nonvolatile semiconductor memory device according to this embodiment includes: forming a tunnel insulating film by binding first organic molecules each having an alkyl molecular chain as the main chain onto a semiconductor layer in a self-assembling manner; forming a charge storage layer made of an inorganic material on the tunnel insulating film; forming a block insulating film on the charge storage layer; and forming a control gate electrode on the block insulating film.

Here, the first organic molecules 30 each have the first end group at one end of the main chain, which is an alkyl molecular chain, and have the second end group at the other end of the main chain. Each of the first organic molecules 30 preferably has a structure in which the first end group is more easily bound chemically to the semiconductor layer 10 than the second end group. Also, in the preferred structure, the second end group is easily bound chemically to the charge storage layer 14.

First, the tunnel insulating film 12 is formed by binding the first organic molecules each having an alkyl molecular chain as the main chain onto the semiconductor layer 10 in a self-assembling manner. A silicon oxide film of 3 nm in thickness, for example, is formed on the surface of a semiconductor layer of p-type single-crystal silicon by thermal oxidation, for example.

The first organic molecules (the tunnel molecules) each having an alkyl molecular chain as the main chain and a structure in which the first end group is more easily bound to the silicon oxide film on the surface of the semiconductor layer than the second end group are then prepared. For example, organic molecules expressed by the above mentioned general formula (1) or (2) are prepared. Alkyl chains each having a derivative of a silyl group such as $-SiCl_3$ at one end, and an azido group ($-N_3$) at the other end are prepared, for example.

The $-SiCl_3$ of the alkyl chains are then bound onto the silicon oxide film on the surface of the semiconductor layer 10 in a self-assembling manner. In this manner, the tunnel insulating film 12 including a self-assembled monolayer (SAM) of the alkyl chains is formed. Either a liquid phase technique or a gas phase technique may be used in binding the alkyl chains.

The charge storage layer 14 made of an inorganic material is then formed on the tunnel insulating film 12. For example, a hafnium oxide layer is formed as the charge storage layer 14 on the tunnel insulating film 12 by ALD (Atomic Layer Deposition). At this point, film formation progresses, as the hafnium oxide is bound to the azido groups ($-N_3$) of the alkyl chains.

Other than ALD, a vapor deposition technique, a sputtering technique, CVD, or the like can be used to form the charge storage layer 14.

After that, the block insulating film 16 is formed on the charge storage layer 14. For example, a silicon oxide film is formed as the block insulating film 16 on the charge storage layer 14 by ALD.

Other than ALD, a vapor deposition technique, a sputtering technique, CVD, or the like can be used to form the block insulating film 16.

After that, the control gate electrode 18 is formed on the block insulating film 16. For example, an impurity-doped polycrystalline silicon film is formed by CVD (Chemical Vapor Deposition), to form the control gate electrode 18. After that, a gate electrode structure is formed by patterning the stacked films.

With the gate electrode structure serving as a mask, n-type impurity ions are implanted, to form the source region 20 and the drain region 22, for example. In this manner, the nonvolatile semiconductor memory device illustrated in FIGS. 1 and 3 can be manufactured.

As described above, this embodiment can provide a scaled down nonvolatile semiconductor memory device having small cell size and a method of manufacturing the nonvolatile semiconductor memory device through a reduction in the film thickness of the tunnel insulating film.

Second Embodiment

A nonvolatile semiconductor memory device of this embodiment is the same as that of the first embodiment, except that the oxide film 12a is not provided between the semiconductor layer 10 and the first organic molecular film 12b. Therefore, the same explanations as those in the first embodiment will not be repeated.

Figure 5:
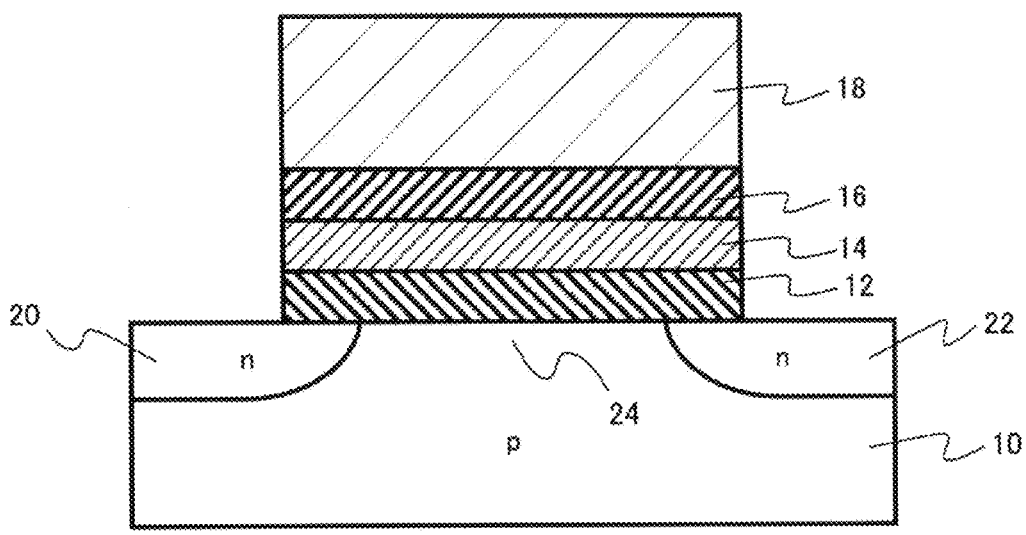
FIG. 5 is a cross-sectional view of a memory cell portion of a nonvolatile semiconductor memory device according to a second embodiment.

FIG. 5 is a cross-sectional view of a memory cell portion of the nonvolatile semiconductor memory device according to this embodiment.

A first organic molecular film is formed directly on a semiconductor layer 10, to form a tunnel insulating film 12, without the intervention of an oxide film.

In this embodiment, it is preferable that the first organic molecules constituting the first organic molecular film are chemically bound directly to the semiconductor layer 10.

This embodiment can achieve the same effects as those of the first embodiment. Since the oxide film is not provided, the manufacturing procedures can be advantageously simplified.

Third Embodiment

A nonvolatile semiconductor memory device of this embodiment is the same as that of the first embodiment, except that the block insulating film contains second organic molecular film including second organic molecules each having an alkyl molecular chain as the main chain. Therefore, the same explanations as those in the first embodiment will not be repeated.

Figure 6:
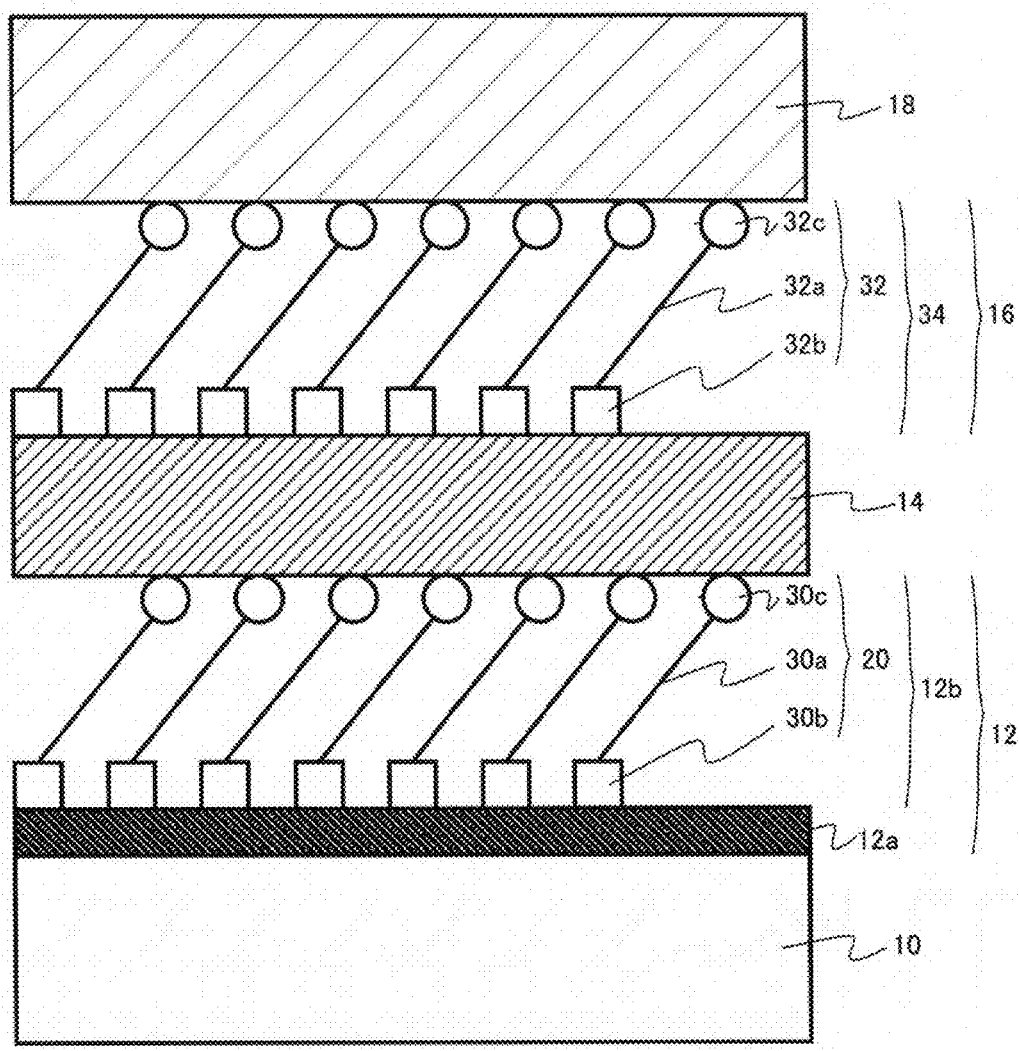
FIG. 6 is an enlarged cross-sectional view of a memory cell portion of a nonvolatile semiconductor memory device according to a third embodiment.

FIG. 6 is an enlarged cross-sectional view of a memory cell portion of the nonvolatile semiconductor memory device according to this embodiment. FIG. 6 is a diagram schematically showing a tunnel insulating film 12 and a block insulating film 16.

The block insulating film 16 includes a second organic molecular film 34 that contains block molecules (second organic molecules) 32 each having an alkyl molecular chain as the main chain.

The block molecules (the second organic molecules) 32 constituting the second organic molecular film 34 each include a main chain 32a, an end group (a third end group) 32b on the side of a charge storage layer 14, and an end group (a fourth end group) 32c on the side of a control gate electrode 18.

The main chains 32a of the block molecules 32 are alkyl molecular chains. The alkyl molecular chains may be alkyl chains, isoalkyl chains, or alkyl halide chains, for example. The block molecules 32 may have side chains.

The second organic molecular film 34 is formed as a self-assembled monolayer on the charge storage layer 14, for example, and is a high-density film.

The block molecules 32 are preferably bound chemically to the charge storage layer 14 by the end groups (the third end groups) 32b on the side of the charge storage layer 14. In a case where the second organic molecular film 34 is a self-assembled monolayer, the chemical binding is inevitable. Also, the block molecules 32 are preferably bound chemically to the control gate electrode 18 by the end groups (the fourth end groups) 32c on the side of the control gate electrode 18.

This is because, as the block molecules 32 constituting the second organic molecular film 34 are bound chemically to the charge storage layer 14 and the control gate electrode 18 as described above, the stability of the film structure is increased, and a nonvolatile semiconductor device with smaller property fluctuations can be realized.

The block molecules (the second organic molecules) 32 are molecules expressed by the following general formula (3) or (4), for example:

[General formula (3)]

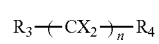

Here, $R_3$ represents the end group (the third end group) on the charge storage layer side, which may be a hydroxy group, an amino group, an azido group, a carboxyl group, or a derivative of any of those groups, for example. $R_4$ represents the end group (the fourth end group) on the control gate electrode side, which may be a silyl group or a derivative thereof, or a phosphoryl group or a derivative thereof, for example. X represents hydrogen (H), fluorine (F), chlorine (Cl), bromine (Br), iodine (I). Meanwhile, n represents a positive integer.

[General formula (4)]

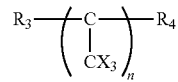

Here, $R_3$ represents the end group (the third end group) on the charge storage layer side, which may be a hydroxy group, an amino group, an azido group, a carboxyl group, or a derivative of any of those groups, for example. $R_4$ represents the end group (the fourth end group) on the control gate electrode side, which may be a silyl group or a derivative thereof, or a phosphoryl group or a derivative thereof, for example. X represents hydrogen (H), fluorine (F), chlorine (Cl), bromine (Br), iodine (I). Meanwhile, n represents a positive integer.

The molecular weight of each of the second organic molecules 32 constituting the block insulating film 16 is preferably larger than the molecular weight of each of the first organic molecules 30 constituting the tunnel insulating film 12. Containing molecules having a larger molecular weight than the first organic molecules 30, the block insulating film 12 can have higher stopping power against electron/hole transfers than the tunnel insulating film 12.

For example, where the first organic molecules 30 are molecules containing alkyl chains, and the second organic chains 32 are molecules containing alkyl halide chains each having the same or a larger carbon number than each of the alkyl chains, the above mentioned condition can be satisfied.

The molecular weights of the molecules contained in the tunnel insulating film 12 and the block insulating film 16 can be measured with a mass spectrometer, for example.

The permittivity of the block insulating film 16 is preferably higher than the permittivity of the tunnel insulating film 12. Therefore, molecules having a larger dipole moment than the first organic molecules 30 are preferably used as the second organic molecules 32.

As described above, the block molecules 32 are preferably bound chemically to the charge storage layer 14 by the end groups (the third end groups) 32b on the side of the charge storage layer 14. Also, the block molecules 32 are preferably bound chemically to the control gate electrode 18 by the end groups (the fourth end groups) 32c on the side of the control gate electrode 18.

Therefore, a functional group that is easily bound chemically to the charge storage layer 14 is preferably selected as each end group (each third end group) 32b on the side of the charge storage layer 14, and a functional group that is easily bound to the control gate electrode 18 is preferably selected as each end group (each fourth end group) 32c on the side of the control gate electrode 18.

The preferred third end group 32b varies depending on the material of the charge storage layer 14 on the other side. In a case where the charge storage layer 14 is made of hafnium oxide (hafnia), for example, an azido group or a derivative thereof can be selected.

The preferred fourth end group 32c varies depending on the material of the control gate electrode 18 on the other side. In a case where the control gate electrode 18 is made of polycrystalline silicon, for example, a silyl group or a derivative thereof can be selected.

Figure 7:
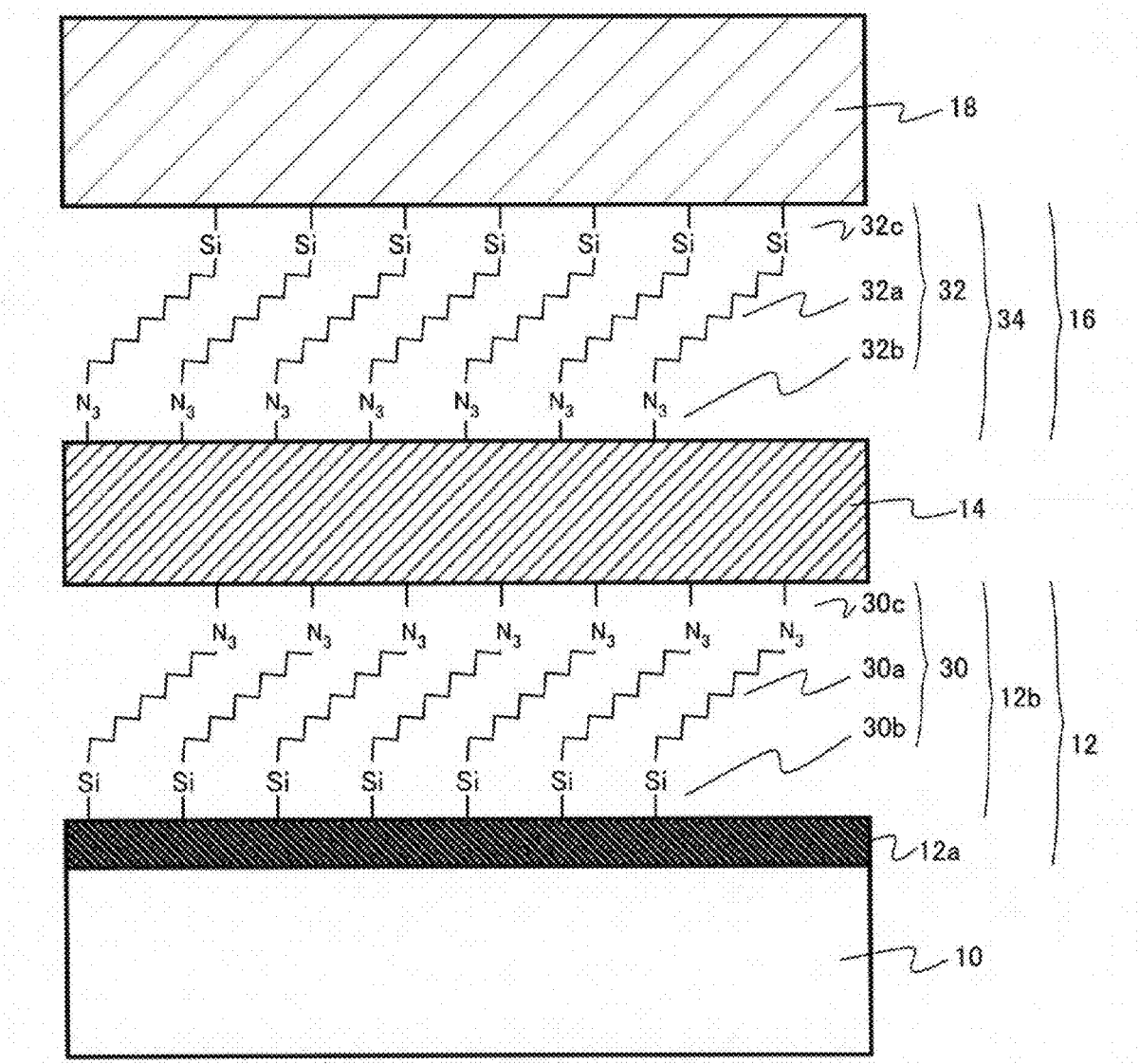
FIG. 7 is a diagram showing an example of the organic molecular film of a memory cell portion of the nonvolatile semiconductor memory device according to the third embodiment.

FIG. 7 is a diagram showing an example of the organic molecular films of a memory cell portion of the nonvolatile semiconductor memory device according to this embodiment. In the illustrated example, each main chain 32a of the second organic molecules 32 is an alkyl chain with a carbon number of 9, each end group (each third end group) 32b on the side of the charge storage layer 14 is an azido group, and each end group (each fourth end group) 32c on the side of the control gate electrode 18 is a silyl group. The charge storage layer 14 is made of hafnium oxide, for example, and the control gate electrode 18 is made of polycrystalline silicon, for example.

Other preferred combinations of the charge storage layer 14 and the third end groups 32b are SiN (silicon nitride) and silyl groups, n-type silicon and silyl groups, p-type silicon and silyl groups, hafnium oxide and phosphone groups, and aluminum and phosphone groups, for example.

As for other preferred combinations of the control gate electrode 18 and the fourth end groups 32c, each of the fourth end groups 32c is a thiol group or a derivative thereof if the control gate electrode 18 is made of a metal such as gold (Au), silver (Ag), copper (Cu), tungsten (W), tungsten nitride (WN), tantalum nitride (TaN), or titanium nitride (TiN). Also, each of the fourth end groups 32c is an alcohol group, a carboxyl group, or a derivative of one of those groups, if the control gate electrode 18 is made of a metal such as tungsten (W), tungsten nitride (WN), tantalum (Ta), tantalum nitride (TaN), molybdenum (Mo), molybdenum nitride (MoN), or titanium nitride (TiN).

An example case where the block insulating film 16 has a single-layer structure including only the second organic molecular film 34 has been described above. However, the block insulating film 16 may of course have a stack structure formed with the second organic molecular film 34 and a film made of an inorganic material such as an oxide film, a nitride film, or an oxynitride film, for example.

So as to reduce the thickness of the block insulating film 16, the angle of the extending direction of each alkyl chain with respect to the normal direction of the upper surface of the semiconductor layer 10 is preferably 30 degrees or more, or more preferably, 45 degrees or more, or even more preferably, 60 degrees or more.

The carbon number in each of the main chains 32a of the block molecules 32 is preferably 8 to 30, or more preferably, 10 to 20. This is because, if the carbon number is below the above mentioned range, insulation resistance might be degraded, and formation of a self-assembled monolayer might become difficult. If the carbon number is beyond the above mentioned range, the film thickness might become greater, resulting in difficulties in scaling down. The carbon number in each of the main chains 32a of the block molecules 32 is more preferably 18, because a self-assembled monolayer can be stably manufactured with such a carbon number.

Next, a method of manufacturing the nonvolatile semiconductor memory device according to this embodiment is described. The method of manufacturing the nonvolatile semiconductor memory device according to this embodiment is the same as the manufacturing method according to the first embodiment, except that the block insulating film is formed by binding the second organic molecules each having an alkyl molecular chain as the main chain to the charge storage layer in a self-assembling manner.

Here, the second organic molecules 32 each have the third end group at one end of the alkyl molecular chain, and have the fourth end group at the other end of the alkyl molecular chain. Each of the second organic molecules 32 preferably has a structure in which the third end group is more easily bound chemically to the charge storage layer than the fourth end group. Also, in the preferred structure, the fourth end group is easily bound chemically to the control gate electrode.

First, layers are formed in the same manner as in the first embodiment, until the charge storage layer 14.

After the formation of the charge storage layer 14, the second organic molecules (the block molecules) 32 each having an alkyl molecular chain as the main chain and a structure in which the third end group is more easily bound chemically to the charge storage layer 14 than the fourth end group are prepared. For example, organic molecules expressed by the above mentioned general formula (3) or (4) are prepared.

In a case where the charge storage layer 14 is a hafnium oxide layer, alkyl halide chains each having an azido group ($-N_3$) as the third end group at one end and a derivative of a silyl group such as $-SiCl_3$ as the fourth end group at the other end are prepared, for example.

The azido groups ($-N_3$) as the third end groups of the alkyl halide chains are then bound onto the hafnium oxide in the charge storage layer 14 in a self-assembling manner. In this manner, the block insulating film 16 including a self-assembled monolayer (SAM) of the alkyl halide chains is formed. Either a liquid phase technique or a gas phase technique may be used in binding the alkyl halide chains.

An impurity-doped polycrystalline silicon film is then formed by CVD (Chemical Vapor Deposition), for example, to form the control gate electrode 18. At this point, the polycrystalline silicon is bound to $-SiCl_3$, which is the fourth end groups.

After that, a gate electrode structure is formed by patterning the stacked films.

With the gate electrode structure serving as a mask, n-type impurity ions are implanted, to form the source region 20 and the drain region 22, for example. In this manner, the nonvolatile semiconductor memory device illustrated in FIG. 7 can be manufactured.

As described above, this embodiment can provide a scaled down nonvolatile semiconductor memory device and a method of manufacturing the nonvolatile semiconductor memory device through reductions in the film thicknesses of the tunnel insulating film and the block insulating film. Although a case in which both a tunnel insulating film and a block insulating film are formed by organic molecules has been described in this embodiment, only a block insulating film may be formed by organic molecules.

Fourth Embodiment

A nonvolatile semiconductor memory device according to this embodiment includes: a substrate; a stacked body that is formed on the substrate, and has insulating layers and control gate electrode layers alternately stacked; a block insulating film that is formed along the side surface of a hole penetrating to the lowermost one of the control gate electrode layers, the hole extending from the upper surface of the stacked body in the stacking direction of the stacked body; a charge storage layer formed along the inner surface of the block insulating film; a tunnel insulating film that is formed along the inner surface of the charge storage layer, and includes a first organic molecular film including first organic molecules each having an alkyl molecular chain as the main chain; and a semiconductor layer formed along the inner surface of the tunnel insulating film.

The nonvolatile semiconductor memory device according to this embodiment differs from that of the third embodiment in being a three-dimensional device utilizing the so-called BiCS (Bit-Cost Scalable) technique. The structure between the semiconductor layer and the control gate electrode is the same as that of the third embodiment. Therefore, the same explanations as those in the third embodiment will not be repeated.

Figure 8:
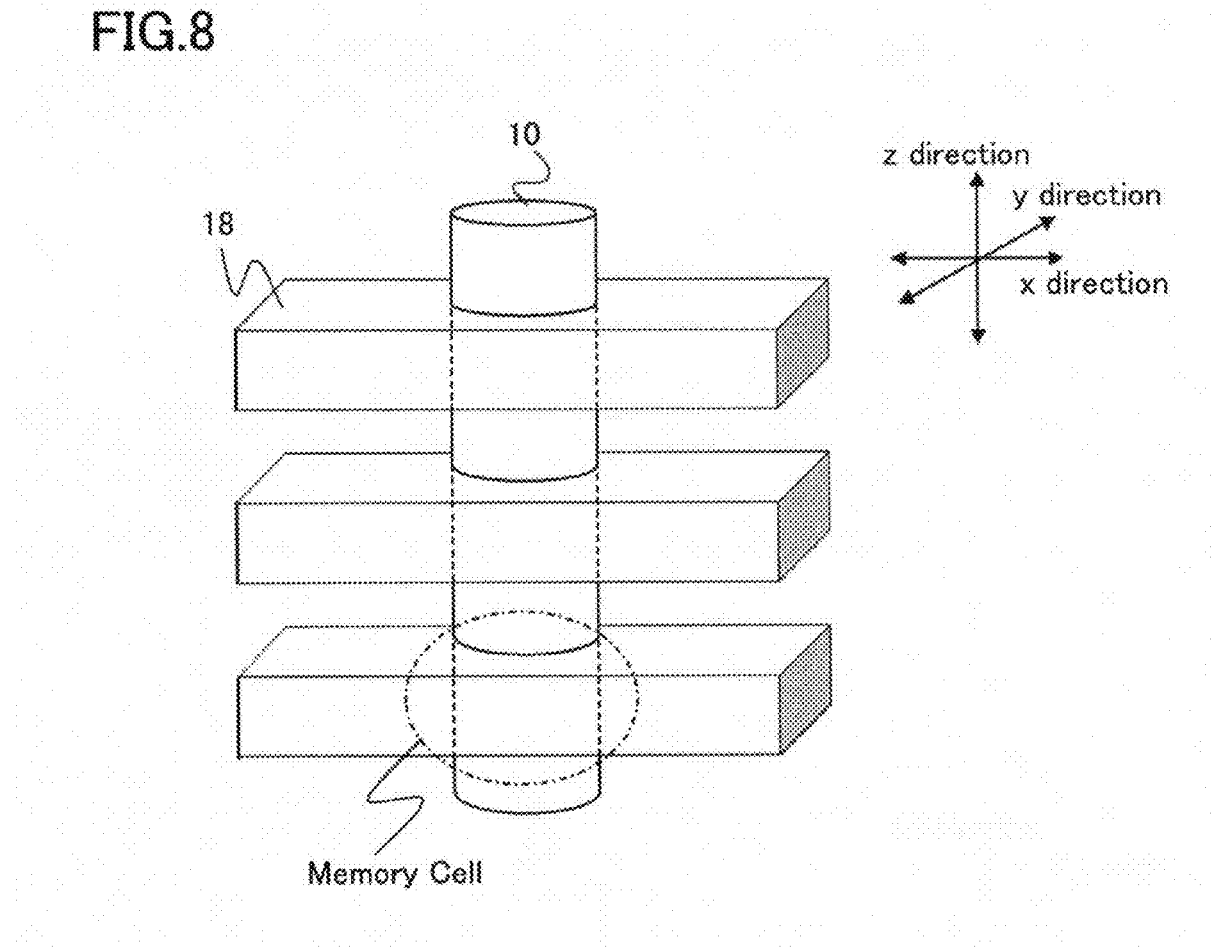
FIG. 8 is a three-dimensional conceptual diagram of a nonvolatile semiconductor memory device according to a fourth embodiment.
Figure 9:
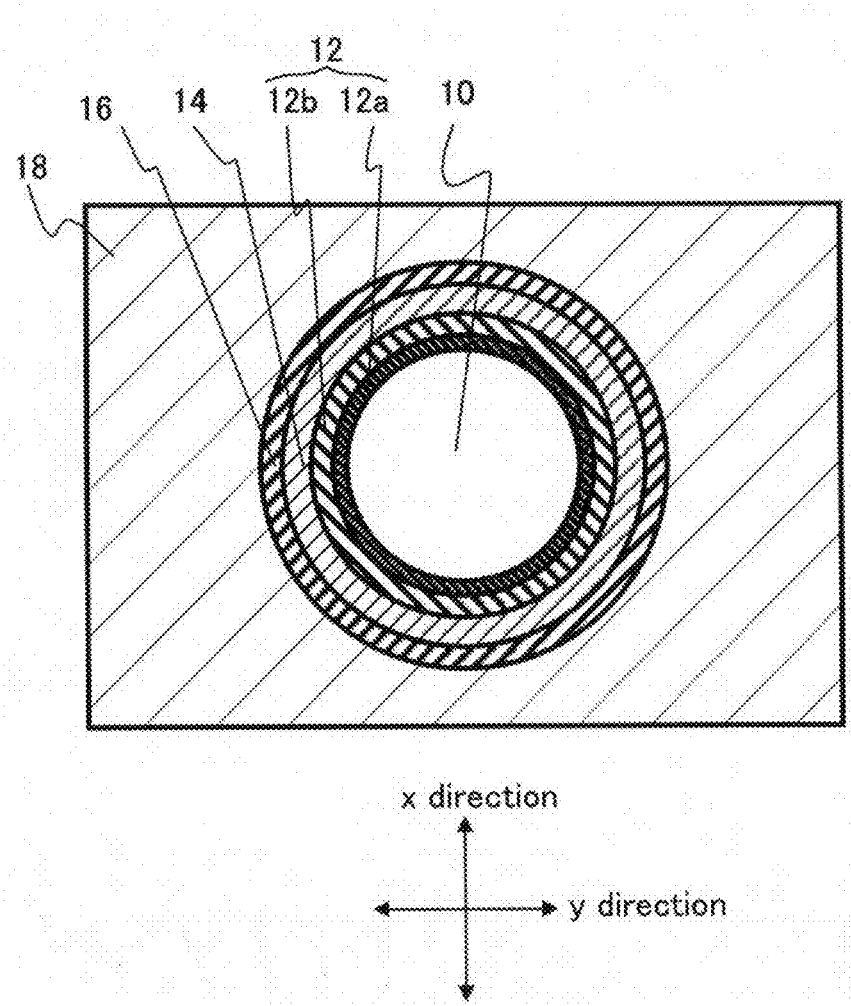
FIG. 9 is an X-Y cross-sectional view of the nonvolatile semiconductor memory device shown in FIG. 8.
Figure 10:
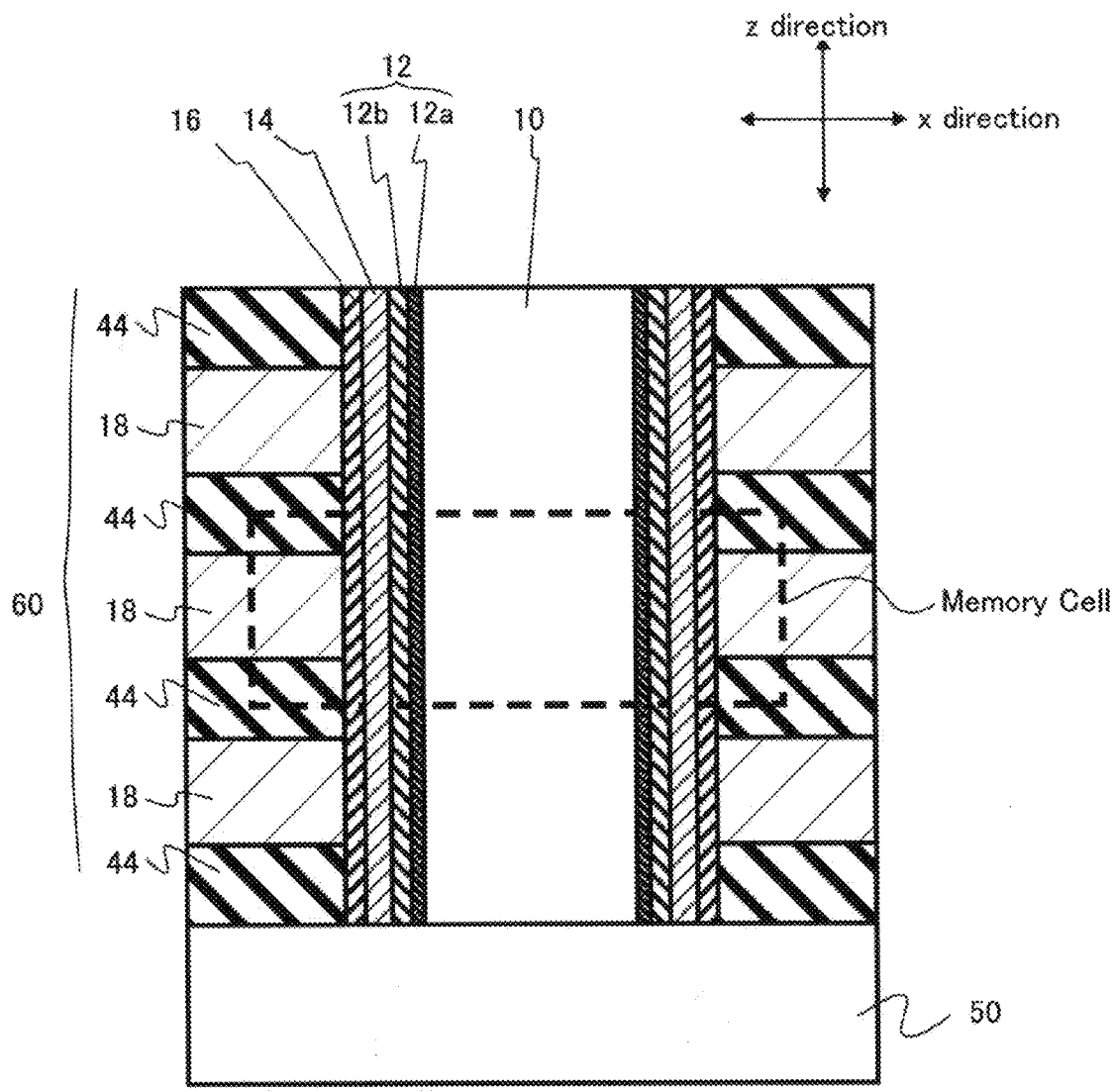
FIG. 10 is an X-Z cross-sectional view of the nonvolatile semiconductor memory device shown in FIG. 8.

FIG. 8 is a three-dimensional conceptual diagram of the nonvolatile semiconductor memory device of this embodiment. FIG. 9 is an X-Y cross-sectional view of the nonvolatile semiconductor memory device shown in FIG. 8. FIG. 10 is an X-Z cross-sectional view of the nonvolatile semiconductor memory device shown in FIG. 9.

The nonvolatile semiconductor memory device of this embodiment includes a stacked body 60 formed by alternately stacking insulating layers 44 and control gate electrodes 18 on a silicon substrate 50, for example.

A hole that extends from the upper surface of the stacked body 60 and penetrates to the lowermost control gate electrode layer 18 is formed. A block insulating film 16 is formed along the side surface of the hole, and a charge storage layer 14 is formed along the inner surface of the block insulating film 16.

A tunnel insulating film 12 is further formed along the inner surface of the charge storage layer 14. A columnar semiconductor layer 10 is also formed along the inner surface of the tunnel insulating film 12. The semiconductor layer 10 is made of polycrystalline silicon, for example.

In each of FIGS. 8 and 10, the region surrounded by a dashed line is a memory cell. Each of the memory cells has a structure in which the tunnel insulating film 12 is formed on the semiconductor layer 10, the charge storage layer (an organic molecular layer) 14 is formed on the tunnel insulating film 12, the block insulating film 16 is formed on the charge storage layer 14, and the control gate electrode 18 is formed on the block insulating film 16.

The tunnel insulating film 12 includes a first organic molecular film including tunnel molecules (first organic molecules) each having an alkyl molecular chain as the main chain, for example. The tunnel insulating film 12 has a stack structure formed with an oxide film formed on the semiconductor layer 10 and the first organic molecular film.

The carbon number in each of the main chains is preferably 8 to 30. The alkyl molecular chains are preferably alkyl chains, isoalkyl chains, or alkyl halide chains.

The block insulating film 16 includes a second organic molecular film that contains block molecules (second organic molecules) each having an alkyl molecular chain as the main chain. The molecular weight of each of the block molecules (the second organic molecules) is preferably larger than the molecular weight of each of the tunnel molecules (the first organic molecules).

Like the third embodiment, this embodiment can provide a scaled down nonvolatile semiconductor memory device and a method of manufacturing the nonvolatile semiconductor memory device through reductions in the film thicknesses of the tunnel insulating film and the block insulating film.

Furthermore, according to this embodiment, three-dimensional memory cells are formed, to increase the degree of memory cell integration. With this structure, a nonvolatile semiconductor memory device having a higher storage capacity than that of the third embodiment can be realized.

As in the first or second embodiment, organic molecules can be contained only in the tunnel insulating film.

According to this embodiment, three-dimensional memory cells are formed, to increase the degree of memory cell integration. With this structure, a nonvolatile semiconductor memory device having a higher storage capacity than that of the second embodiment can be realized. In the BiCS structure of this embodiment, the reduction in the thickness of the film structure of each memory cell leads directly to the higher degree of memory integration. Thus, the film structure of this embodiment in which the organic molecular films have all the functions of a tunnel insulating film and a block insulating film is highly beneficial.

In each of the first through fourth embodiments, the transistor of each of the memory cells is an n-type transistor having electrons as carriers. However, each of the memory cell transistors can also be p-type transistor having holes as carriers.

EXAMPLES

In the following, examples are described.

Example 1

A film structure according to the first embodiment is formed and evaluated.

Molecules each having an alkyl chain that has one end terminated with a silanol group, which is a derivative of a silyl group, has the other end terminated with an azido group, and has a carbon number of 8, are prepared as the first organic molecules 30 constituting the first organic molecular film 12a of the tunnel insulating film 12. That is, $N_3(CH_2)_8SiCl_3$ is prepared. Using the molecules, a silicon oxide film of 3 nm in film thickness is formed on a clean p-type silicon substrate through thermal oxidation. A self-assembled monolayer (SAM) is then grown on the substrate irradiated with UV.

A hafnium oxide layer of 5 nm in film thickness is formed as the charge storage layer 14 on the tunnel insulating film 12 by ALD. At this point, film formation progresses, as the hafnium oxide is bound to the azido groups (—$N_3$) of the alkyl chains.

A silicon oxide film of 10 nm in film thickness is then formed as the block insulating film 16 on the charge storage layer 14 by ALD. After that, aluminum is vapor-deposited on the block insulating film 16, to form a gate electrode. In this manner, a sample is completed.

A voltage generated by superimposing a direct-current voltage V on an alternating-current voltage having low amplitude is applied between the p-type silicon substrate (hereinafter referred to as the substrate electrode) and the aluminum electrode (hereinafter referred to as the gate electrode) of the sample, and the current component at 90 degrees with respect to the voltage in terms of phase is measured, to determine the relationship between the capacitance C of the sample and the direct-current voltage V (hereinafter referred to as the C-V characteristics). From the C-V characteristics, it is possible to measure the potential difference between the gate electrode and the substrate electrode (hereinafter referred to as the gate voltage) when the charges are neutral in the interface between the silicon substrate and the oxide film.

This gate voltage is known as the flat band voltage. When there exist charges between the substrate electrode and the gate electrode, the flat band voltage varies, because voltage is required for neutralizing the line of electric force generated from the charges.

When the voltage at which charges are injected into the charge storage layer 14 (this voltage will be hereinafter referred to as the write voltage) is applied as the gate voltage, the flat band voltage varies in proportion to the amount of charges injected into the charge storage layer 14. By measuring the change caused in the flat band voltage by the application of the write voltage, the amount of charges injected into the charge storage layer 14 can be measured. After the write voltage application, the charge retention characteristics were measured by continuously measuring the change in the flat band voltage with time.

Example 2

The same evaluation as that in Example 1 was conducted, except that the carbon number in each alkyl chain was 6, instead of 8.

In Example 1, the charge retention time was approximately 100 times longer than that in Example 2. In this manner, it was confirmed that the charge retention characteristics were improved by increasing the carbon number.

While certain embodiments have been described, these embodiments have been presented by way of example only, and are not intended to limit the scope of the inventions. Indeed, nonvolatile semiconductor memory device and manufacturing method thereof described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
   a semiconductor layer;
   a tunnel insulating film formed on the semiconductor layer, the tunnel insulating film including a first organic molecular film including first organic molecules each having an alkyl molecular chain as a main chain;
   a charge storage layer formed on the tunnel insulating film, the charge storage layer being made of an inorganic material;
   a block insulating film formed on the charge storage layer; and
   a control gate electrode formed on the block insulating film,
   wherein the block insulating film includes a second organic molecular film including second organic molecules each having an alkyl molecular chain as a main chain.

2. The device according to claim 1, wherein a carbon number in the main chain is 8 to 30.

3. The device according to claim 1, wherein the tunnel insulating film has a stack structure formed with an oxide film formed on the semiconductor layer and the first organic molecular film formed on the oxide film.

4. The device according to claim 3, wherein the oxide film is one of a silicon oxide film and an aluminum oxide film.

5. The device according to claim 1, wherein the alkyl molecular chain is one of an alkyl chain, an isoalkyl chain, and an alkyl halide chain.

6. The device according to claim 1, wherein the charge storage layer includes one of silicon nitride, silicon oxynitride, aluminum oxide, aluminum oxynitride, hafnium oxide, hafnium nitride, hafnium oxynitride, hafnium aluminate, hafnium nitride aluminate, hafnium silicate, hafnium nitride silicate, lanthanum oxide, lanthanum aluminate, gold, aluminum, and carbon.

7. The device according to claim 1, wherein the second organic molecules each has a larger molecular weight than a molecular weight of each of the first organic molecules.

8. The device according to claim 1, wherein an end group of each of the first organic molecules on the side of the semiconductor layer is one of a silyl group and a derivative thereof, and an end group of each of the first organic molecules on the side of the charge storage layer is one of an azido group and a derivative thereof.

9. The device according to claim 1, wherein the first organic molecular film is a monolayer molecular film.

10. The device according to claim 1, wherein a film thickness of the first organic molecular film is greater than or equal to 0.8 nm and less than or equal to 3.5 nm.

11. A method of manufacturing a nonvolatile semiconductor memory device, comprising:
    forming a tunnel insulating film by binding first organic molecules each having an alkyl molecular chain as a main chain onto a semiconductor layer in a self-assembling manner;
    forming a charge storage layer made of an inorganic material on the tunnel insulating film;
    forming a block insulating film on the charge storage layer; and
    forming a control gate electrode on the block insulating film,
    wherein the forming the block insulating film includes binding second organic molecules each having an alkyl molecular chain as a main chain to the charge storage layer in a self-assembling manner.

12. The method according to claim 11, further comprising forming an oxide film on a surface of the semiconductor layer prior to the binding the first organic molecules onto the semiconductor layer.

13. A nonvolatile semiconductor memory device comprising:
- a substrate;
- a stacked body formed on the substrate, the stacked body having insulating layers and control gate electrode layers alternately stacked;
- a block insulating film formed along a side surface of a hole penetrating to the lowermost one of the control gate electrode layers, the hole extending from an upper surface of the stacked body in a stacking direction of the stacked body;
- a charge storage layer formed along an inner surface of the block insulating film;
- a tunnel insulating film formed along an inner surface of the charge storage layer, the tunnel insulating film including a first organic molecular film including first organic molecules each having an alkyl molecular chain as a main chain; and
- a semiconductor layer formed along an inner surface of the tunnel insulating film.

14. The device according to claim 13, wherein a carbon number in the main chain is 8 to 30.

15. The device according to claim 13, wherein the tunnel insulating film has a stack structure formed with an oxide film formed on the semiconductor layer and the first organic molecular film.

16. The device according to claim 13, wherein the block insulating film includes a second organic molecular film including second organic molecules each having an alkyl molecular chain as a main chain.

17. The device according to claim 13, wherein the alkyl molecular chain is one of an alkyl chain, an isoalkyl chain, and an alkyl halide chain.

18. The device according to claim 13, wherein a film thickness of the first organic molecular film is greater than or equal to 0.8 nm and less than or equal to 3.5 nm.

* * * * *